US010128463B2

(12) United States Patent
Furuie

(10) Patent No.: US 10,128,463 B2
(45) Date of Patent: Nov. 13, 2018

(54) DISPLAY DEVICE

(71) Applicant: Japan Display Inc., Minato-ku (JP)

(72) Inventor: Masamitsu Furuie, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/812,485

(22) Filed: Nov. 14, 2017

(65) Prior Publication Data

US 2018/0069195 A1    Mar. 8, 2018

Related U.S. Application Data

(63) Continuation of application No. 15/297,448, filed on Oct. 19, 2016, now Pat. No. 9,847,508.

(30) Foreign Application Priority Data

Feb. 19, 2016 (JP) .................................. 2016-029492

(51) Int. Cl.
*H01L 51/52* (2006.01)
*H01L 27/32* (2006.01)

(52) U.S. Cl.
CPC ...... *H01L 51/5253* (2013.01); *H01L 27/3272* (2013.01); *H01L 51/5246* (2013.01); *H05K 999/99* (2013.01); *H01L 27/3244* (2013.01)

(58) Field of Classification Search
CPC . H01L 51/52; H01L 51/5253; H01L 51/5221; H01L 51/5246; H01L 27/3272
See application file for complete search history.

(56) References Cited

U.S. PATENT DOCUMENTS

| 2003/0164674 A1 | 9/2003 | Imamura |
| 2006/0270305 A1 | 11/2006 | Imamura |
| 2009/0179566 A1 | 7/2009 | Imamura |
| 2011/0090436 A1 | 4/2011 | Choi et al. |
| 2015/0144977 A1* | 5/2015 | Odaka ............... H01L 33/44 257/98 |
| 2016/0018706 A1 | 1/2016 | Niwano et al. |

(Continued)

FOREIGN PATENT DOCUMENTS

| JP | 2008-165251 | 7/2008 |
| JP | 2011-124160 A | 6/2011 |

(Continued)

OTHER PUBLICATIONS

Office Action issued in corresponding Taiwanese Application No. 105134673 dated Sep. 11, 2017 (with English translation).

(Continued)

*Primary Examiner* — Phuc Dang
(74) *Attorney, Agent, or Firm* — Oblon, McClelland, Maier & Neustadt, L.L.P.

(57) ABSTRACT

A display device, including a display region formed of a plurality of pixels and a frame region formed on an outer side of the display region, includes a sealing film configured to cover the display region, a blocking portion formed in the frame region surrounding the display region, and buffering portions formed at least at two positions so as to be separated from each other on at least one straight line path extending from the display region to reach the blocking portion.
In one embodiment of the present invention, the buffering portions have a wave shape in plan view.

19 Claims, 7 Drawing Sheets

(56) References Cited

U.S. PATENT DOCUMENTS

| | | | |
|---|---|---|---|
| 2016/0079564 A1* | 3/2016 | Shim | H01L 51/5256 257/40 |
| 2016/0260936 A1 | 9/2016 | Okamoto et al. | |
| 2017/0045782 A1 | 2/2017 | Cho | |
| 2017/0077456 A1* | 3/2017 | Chung | H01L 51/5259 |

FOREIGN PATENT DOCUMENTS

| | | | |
|---|---|---|---|
| JP | 2012-3989 A | 1/2012 |
| KR | 10-2015-0025994 A | 3/2015 |
| TW | 2014-17265 A | 5/2017 |

OTHER PUBLICATIONS

Office Action dated Feb. 9, 2018 in Korean Patent Application No. 10-2016-0140226 with English translation, 10 pages.
Office Action dated Aug. 13, 2018, in Korean Patent Application No. 10-2016-0140226 (with English-language Translation).
Office Action dated Sep. 18, 2018, in Korean Patent Application No. 10-2016-0140226 with English-language Translation.

* cited by examiner

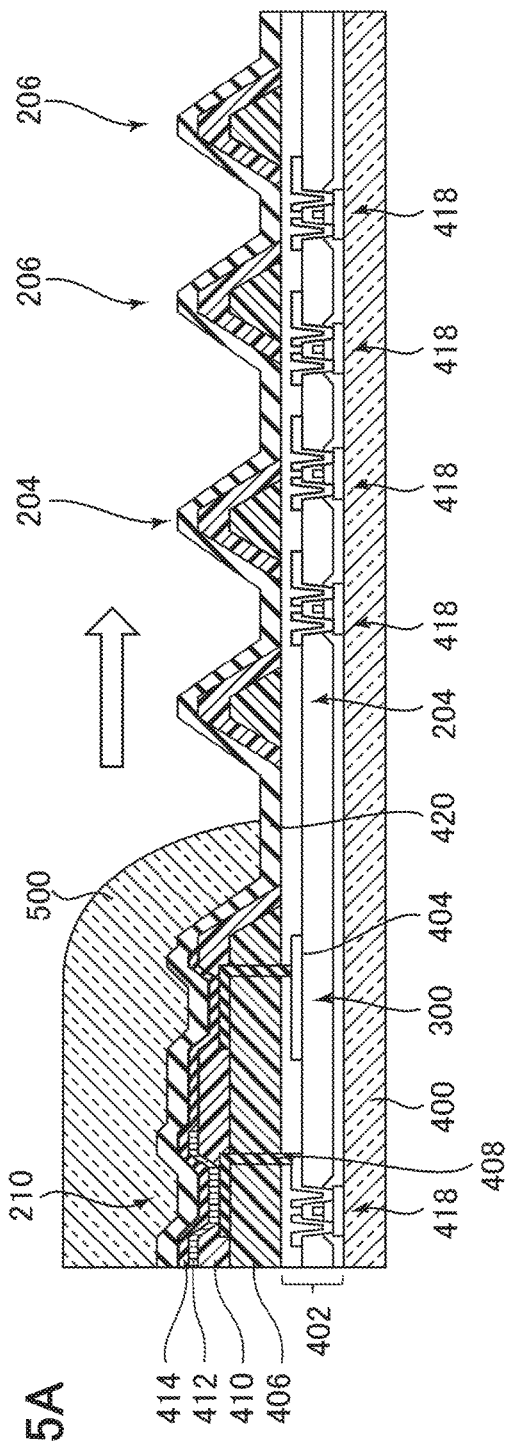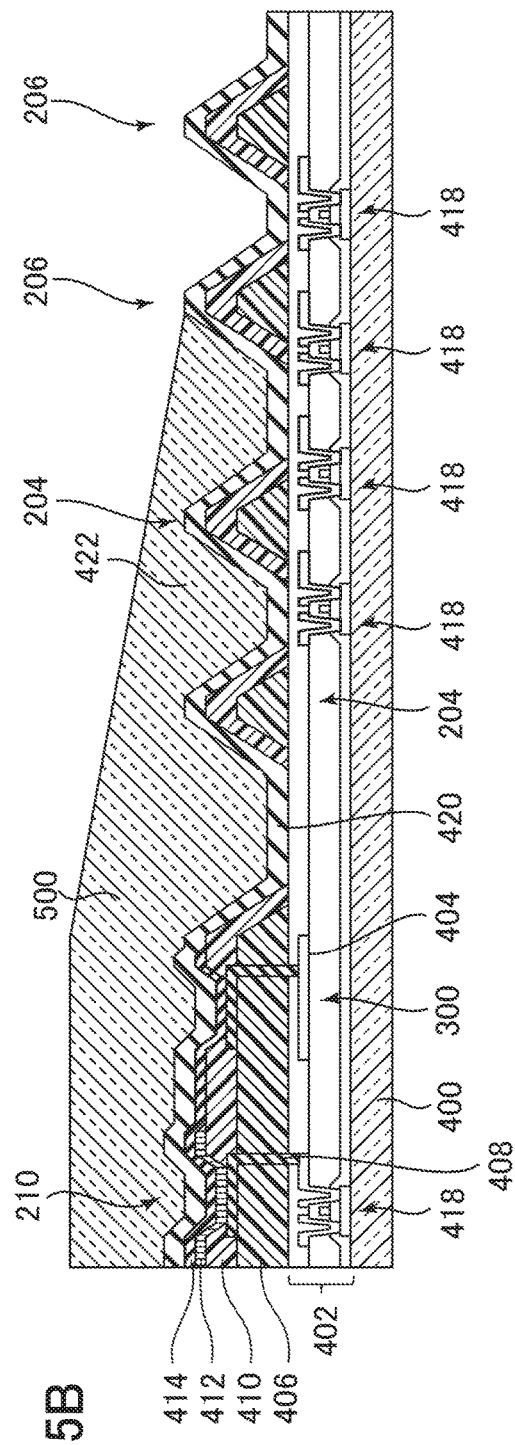

DISPLAY DEVICE

CROSS-REFERENCE TO RELATED APPLICATION

This is a continuation of U.S. application Ser. No. 15/297,448, filed on Oct. 19, 2016 (now U.S. Pat. No. 9,847,508), which claims priority from the Japanese Application JP 2016-29492 filed on Feb. 19, 2016, the entire content of which are hereby incorporated by reference.

BACKGROUND OF THE INVENTION

Field of the Invention

The present invention relates to a display device.

Description of the Related Art

In recent years, display devices such as liquid crystal display devices and organic electro-luminescent (EL) display devices using organic EL elements have been put into practical uses. However, the organic EL elements are vulnerable to moisture, and hence there has been a fear in that the organic EL elements are deteriorated due to moisture to cause lighting failure, e.g., dark spots. Further, even in the liquid crystal display devices, there has been a problem in that the characteristics of thin film transistors vary due to entering moisture to cause deterioration in display quality.

In view of the above, for example, in Japanese Patent Application Laid-open No. 2008-165251, the following display device is disclosed. A closed-loop blocking portion surrounding a display region on its inner side is formed. A multi-layered sealing film including a planarizing resin layer and a barrier layer is formed above the display region and on the inner side of the blocking portion. In this manner, a display element is sealed to prevent deterioration in display quality.

SUMMARY OF THE INVENTION

A sealing planarizing film is formed into a film shape by applying a low-viscosity resin to a panel by printing, an ink jet method, or other methods. In this case, as in Japanese Patent Application Laid-open No. 2008-165251, it is general to form, on the panel surface, a structure for blocking the wetting and spreading resin. However, the applied resin has a high wetting and spreading ability, and the film forming position accuracy is not so high. Thus, there is a fear in that the resin may climb over the blocking structure.

The present invention has been made in view of the above-mentioned problem, and has an object to provide an image display device capable of preventing a resin from climbing over a blocking structure by forming, on the inner side of the blocking structure, a buffering structure configured to decrease a wetting and spreading speed of an applied resin.

According to one aspect of the present invention, a display device including a display region formed of a plurality of pixels and a frame region formed on an outer side of the display region, includes a sealing film configured to cover the display region, a blocking portion formed in the frame region surrounding the display region, and buffering portions formed at least at two positions so as to be separated from each other on at least one straight line path extending from the display region to reach the blocking portion.

In one embodiment of the present invention, the buffering portions have a wave shape in plan view.

In one embodiment of the present invention, the buffering portions are arranged at a predetermined interval in plan view.

In one embodiment of the present invention, the buffering portions have a gap at a corner of the frame region.

In one embodiment of the present invention, the buffering portions are formed lower than the blocking portion in sectional view.

In one embodiment of the present invention, the buffering portions formed at the two positions so as to be separated from each other are formed so as to be higher on an inner side in sectional view.

According to an another aspect of the present invention, a display device including a display region formed of a plurality of pixels and a frame region formed on an outer side of the display region, includes a pixel comprising a pixel circuit and a light emitting element corresponding to the pixel circuit, a sealing film configured to cover the display region and the frame region, a substrate having the pixel formed thereon, a blocking portion formed in the frame region so as to upwardly protrude, and two buffering portions formed between the display region and the blocking portion so as to be separated from each other and to protrude toward the sealing film side.

In one embodiment of the present invention, the blocking portion is formed of a resin layer formed between the light emitting element and a circuit layer in which the pixel circuit is formed.

In one embodiment, of the present invention, the sealing film comprises a lower layer barrier film, an upper layer barrier film, and a sealing planarizing film formed between the lower layer barrier film and the upper layer barrier film. The sealing planarizing film is thinner in the frame region than in the display region.

In one embodiment of the present invention, the sealing film has a thickness that is gradually decreased toward an end of the substrate.

BRIEF DESCRIPTION OF THE DRAWINGS

FIG. 5A and FIG. 5B are views for illustrating a method of forming a sealing planarizing film.

DETAILED DESCRIPTION OF THE INVENTION

Figure 1:
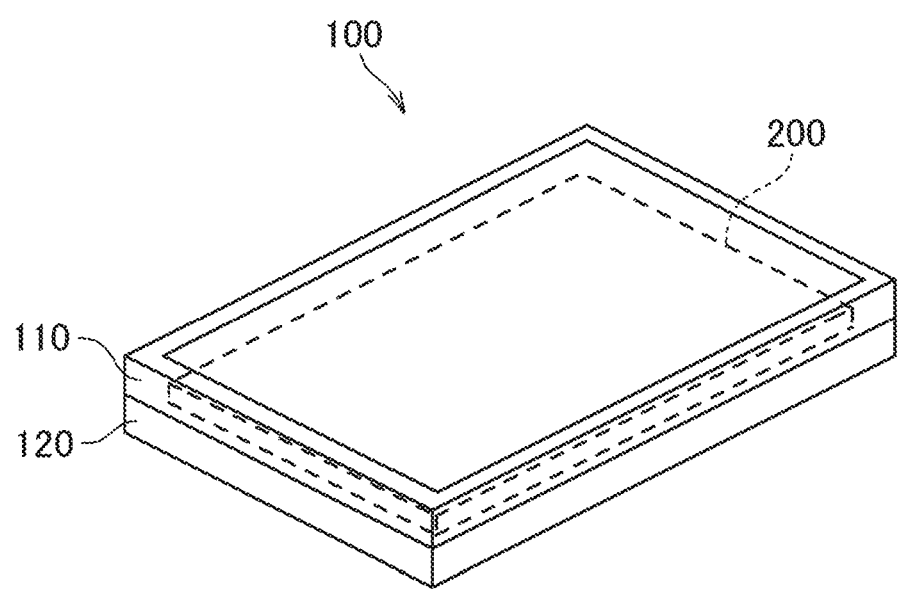
FIG. 1 is a view for schematically illustrating a display device according to an embodiment of the present invention.

Now, embodiments of the present invention are described with reference to the attached drawings. For clearer illustration, some widths, thicknesses, shapes, and the like of respective portions are schematically illustrated in the drawings in comparison to actual dimensions. However, the widths, the thicknesses, the shapes, and the like are merely an example, and do not limit understanding of the present invention. Further, like elements as those described relating to the drawings already referred to are denoted by like reference symbols herein and in each of the drawings, and detailed description thereof is sometimes omitted as appropriate.

FIG. 1 is a view for schematically illustrating a display device 100 according to an embodiment of the present invention. As illustrated in FIG. 1, the display device 100 includes an organic EL panel 200 fixed and sandwiched between an upper frame 110 and a lower frame 120.

Figure 2:
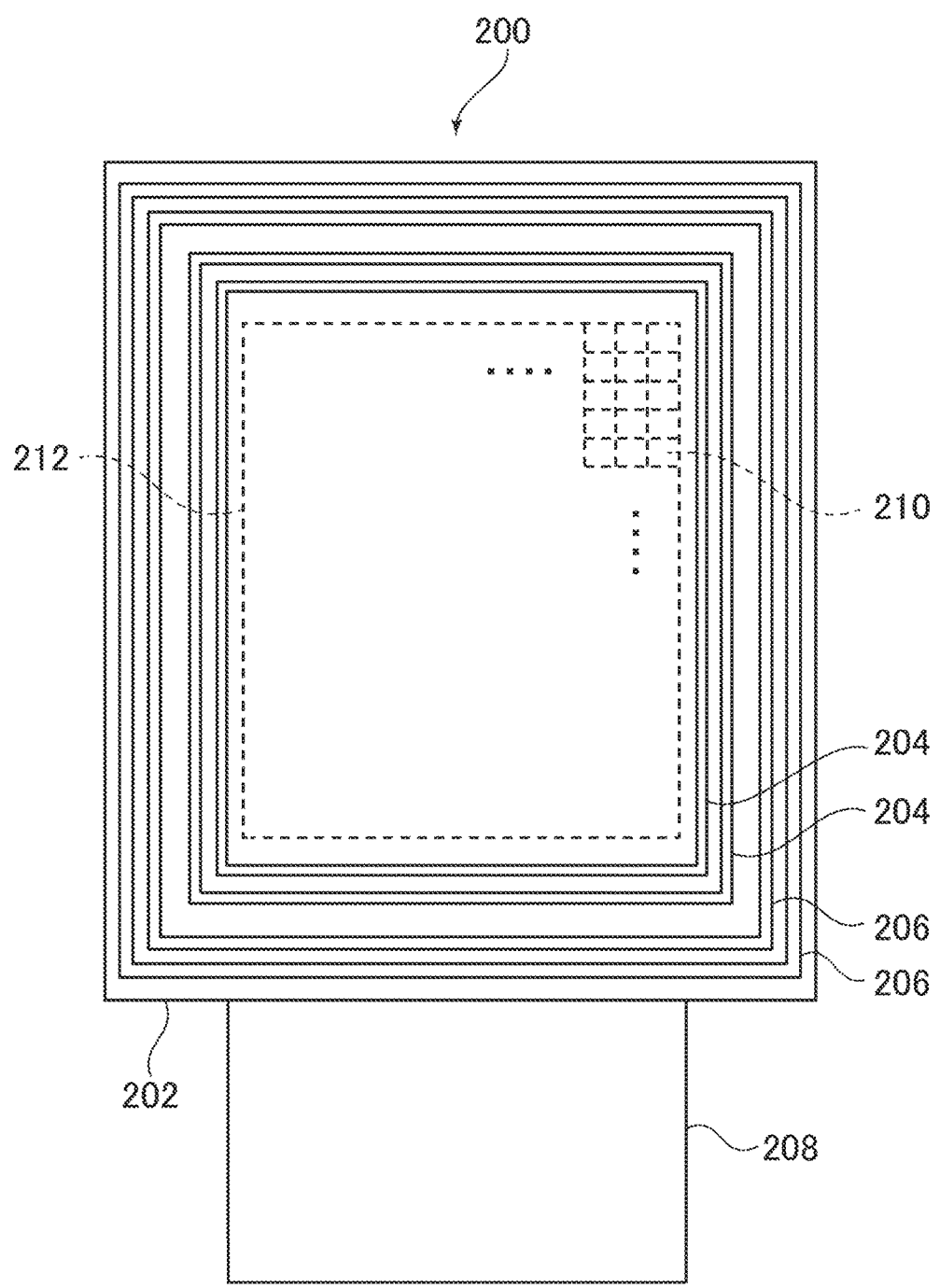
FIG. 2 is a view for illustrating a configuration of an organic EL panel as viewed from a display side thereof.

FIG. 2 is a schematic view for illustrating the configuration of the organic EL panel 200 of FIG. 1. As illustrated in FIG. 2, the organic EL panel 200 includes an array substrate 202 and a flexible printed circuit (FPC) 208. The array substrate 202 includes a display region 212 formed of a plurality of pixels 210, and a frame region formed so as to surround an outer side of the display region 212. Each of the pixels 210 includes a pixel circuit formed in the lower layer, and a light emitting element corresponding to the pixel circuit. Further, the frame region of the array substrate 202 includes buffering portions 204 and blocking portions 206 formed so as to surround the display region 212. Details of the buffering portions 204 and the blocking portions 206 are described later. The FPC 208 is configured to transmit, to the display region 212, a signal supplied from the outside of the organic EL panel 200. The plurality of pixels 210 formed in the display region 212 are configured to emit light based on the signal supplied via the FPC 208, to thereby display an image in the display region 212.

Figure 3:
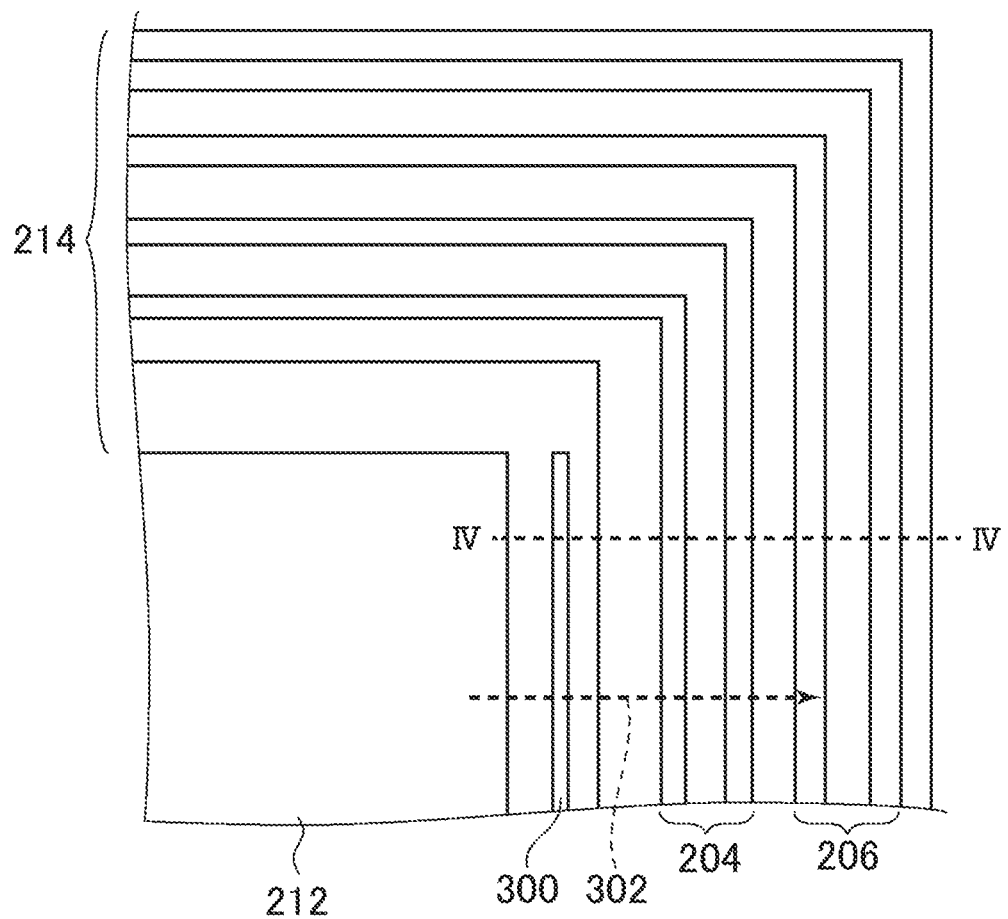
FIG. 3 is an enlarged view of an upper right corner of the organic EL panel.
Figure 4:
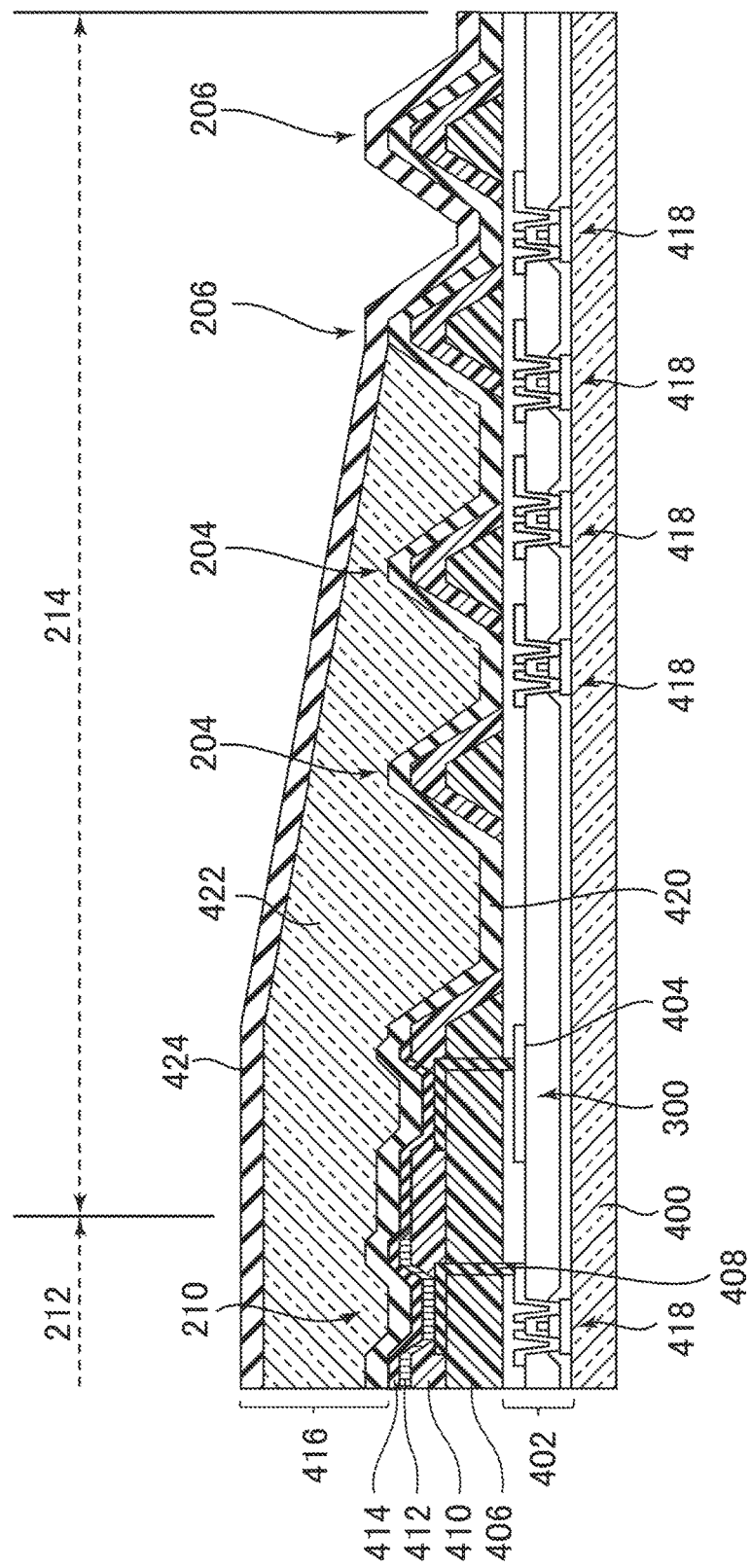
FIG. 4 is a view for illustrating a cross section of the organic EL panel.

FIG. 3 is an enlarged view of an upper right corner of the organic EL panel 200 illustrated in FIG. 2, and FIG. 4 is a partial sectional view thereof. As illustrated in FIG. 3, the organic EL panel 200 includes the display region 212, and a frame region 214 formed on the outer side of the display region 212. Further, in the frame region 214, a cathode contact 300, the buffering portions 204, and the blocking portions 206 are formed in the stated order from the inner side toward the outer side. The cathode contact 300 is configured to electrically connect cathode wiring 404, which is formed in the same layer as source wiring and drain wiring, and a cathode electrode 414, which is formed in the display region 212, to each other via a contact hole formed through a planarizing film 406. The cathode electrode 414 and the cathode wiring 404 can be electrically connected to each other without adding a process by forming, between the cathode wiring 404 and the cathode electrode 414, a conductive layer formed in the same layer as an anode electrode 408. Details of the cathode wiring 404, the anode electrode 408, the cathode electrode 414, and the planarizing film 406 are described later.

The buffering portions 204 are formed at least at two positions so as to be separated from each other on at least one straight line path extending from the display region 212 to reach the blocking portion 206. In other words, two buffering portions 204 are formed between the display region 212 and the blocking portion 206 so as to be separated from each other and to protrude toward a sealing film 416 (described later) side. The buffering portions 204 enable the wetting and spreading speed of a sealing material 500 (described later) to be decreased, to thereby prevent a situation where the sealing material 500 climbs over the blocking portion 206. Specifically, for example, as illustrated in FIG. 3, on a path 302 extending from the display region 212 to reach the blocking portion 206, the buffering portions 204 are formed at two positions so as to be separated from each other.

In the embodiment illustrated in FIG. 2 and FIG. 3, the buffering portions 204 are doubly formed seamlessly so as to surround the display region 212, and hence the buffering portions 204 are always formed at two positions so as to be separated from each other on any one straight line path. However, the shape of the buffering portions 204 is not limited to the shape illustrated in FIG. 3. When the buffering portions 204 have other shapes, the buffering portions 204 are only required to be formed at two positions so as to be separated from, each other on at least one straight line path, and depending on the straight line path, the number of positions at which the buffering portion 204 is formed may be one or less. The shapes of the buffering portions 204 according to other embodiments of the present invention are described later.

The blocking portions 206 are formed in the frame region 214 surrounding the display region 212. Specifically, for example, as illustrated in FIG. 3, the blocking portions 206 are doubly formed seamlessly on the outer side of the buffering portions 204. When the blocking portion 206 is seamlessly formed on the outer side of the buffering portion 204, the blocking portion 206 blocks the sealing material 500 on the inner side of the frame region 214. In FIG. 3, there is illustrated an embodiment in which the blocking portions 206 are doubly formed, but the blocking portion 206 is only required to be seamlessly formed such that the sealing material 500 is prevented from leaking outside of the frame region 214. Therefore, a single blocking portion 206 may be formed. Further, the blocking portion 206 may be formed of a resin layer formed between a light emitting layer and a circuit layer 402 in which the pixel circuit is formed.

Subsequently, FIG. 4 is an example of a view for schematically illustrating a cross section of the organic EL panel 200 from an end of the display region 212 to the frame region 214, and is a sectional view taken along the line IV-IV of FIG. 3. As illustrated in FIG. 4, the array substrate 202 includes a substrate 400, the circuit layer 402 formed on the substrate 400, the planarizing film 406, the anode electrode 408, a rib 410, an EL layer 412, the cathode electrode 414, and the sealing film 416. The substrate 400 may be a glass substrate or a flexible substrate of polyimide or the like.

The circuit layer 402 includes, in an upper layer of the substrate 400, an insulating layer, a source electrode, a drain electrode, a gate electrode, a semiconductor layer, the cathode wiring 404, and the like. The source electrode, the drain electrode, the gate electrode, and the semiconductor layer form a transistor 418. For example, the circuit layer 402 in the display region 212 includes a transistor 418 configured to cause the EL layer 412 formed in the pixel 210 to emit light. Further, the circuit layer 402 in the frame region 214 includes a transistor 418 configured to control timing of light emission of the EL layer 412. The cathode wiring 404 is formed in the frame region 214, and is configured to transmit, to the cathode electrode 414 formed in the display region 212, a signal supplied to the organic EL panel 200 through the FPC 208 via a contact hole formed through the planarizing film 406.

The planarizing film 406 is formed so as to cover the circuit layer 402 from the display region 212 to a region in which the cathode contact 300 is formed. The planarizing film 406 is configured to prevent short-circuit between the anode electrode 408 and an electrode included in the circuit layer 402, and to planarize the steps caused by the wiring and the transistors 418 formed in the circuit layer 402. The planarizing film 406 has the contact hole formed therethrough in the region in which the cathode contact 300 is formed, and the cathode wiring 404 included in the circuit layer 402 and the cathode electrode 414 are electrically connected to each other.

Further, the planarizing film 406 is formed as parts of the buffering portions 204 and parts of the blocking portions 206 on the outer side of the region in which the cathode contact 300 is formed. Specifically, for example, as illustrated in FIG. 4, the planarizing films 406 are formed into a protruded shape at two positions so as to be separated from each other on the outer side of the region in which the cathode contact 300 is formed. The two protruded planarizing films 406 form the buffering portions 204 together with the ribs 410 and a lower layer barrier film 420 (described later) formed in the upper layer. The planarizing films 406 are further formed into a protruded shape at two positions so as to be separated from each other on the outer side of the buffering portions 204. The two protruded planarizing films 406 form the blocking portions 206 together with the ribs 410 and the lower layer barrier film 420 formed in the upper layer. The blocking portion 206 is formed into an upwardly-protruded shape in the frame region 214, and two buffering portions 204 are formed between the display region 212 and the blocking portion 206 so as to be separated from each other and to protrude toward the sealing film 416 side. In FIG. 4, there is illustrated a case where the planarizing films 406 formed as parts of the blocking portions 206 are formed at two positions, but the planarizing film 406 may be formed only at one position.

The anode electrode 408 is formed in an upper layer of the planarizing film 406. Specifically, the anode electrode 408 is formed in the display region 212 so as to be electrically connected to the source electrode or the drain electrode of the transistor 418 formed in the circuit layer 402 via the contact hole of the planarizing film 406.

The rib 410 is formed in the display region 212 so as to cover each peripheral edge of the anode electrode 408. The rib 410 can prevent short-circuit between the anode electrode 408 and the cathode electrode 414. Further, the rib 410 is formed in the frame region 214 so as to cover the protruded planarizing film 406 formed as each of a part of the buffering portion 204 and a part of the blocking portion 206.

The EL layer 412 is formed in the upper layer of the anode electrode 408. Specifically, the EL layer 412 is formed in the display region 212 on the upper layer side of the anode electrode 408 and an end of the rib 410. Further, the EL layer 412 is formed by laminating a hole injection layer, a hole transport layer, a light emitting layer, an electron injection layer, and an electron transport layer. The light emitting layer is configured to emit light by recombining the holes injected from the anode electrode 408 with the electrons injected from the cathode electrode 414. The hole injection layer, the hole transport layer, the electron injection layer, and the electron transport layer are similar to those in the related art, and hence description thereof is omitted herein. In this embodiment, the light emitting layer is formed with use of materials for emitting red light, green light, and blue light. Further, the light emitting element described in the appended claims corresponds to the EL layer 412.

The cathode electrode 414 is formed in the upper layer of the EL layer 412, and is configured to cause the light emitting layer included in the EL layer 412 to emit light when current is caused to flow between the cathode electrode 414 and the anode electrode 408. The cathode electrode 414 is formed of, for example, a transparent conductive film containing metal, e.g., ITO and IZO, or a light-transmissive metal thin film made of AgMg.

The sealing film 416 is formed so as to cover the display region 212 and the frame region 214. Further, the sealing film 416 includes the lower layer barrier film 420, a sealing planarizing film 422, and an upper layer barrier film 424. The lower layer barrier film 420 is formed from the display region 212 to the frame region 214 so as to cover the upper layer of the cathode electrode 414, the rib 410, and the circuit layer 402. The lower layer barrier film 420 formed in the upper layer of the planarizing film 406 in the frame region 214 is formed as each of a part of the buffering portion 204 and a part of the blocking portion 206.

The sealing planarizing film 422 is formed so as to cover the plurality of pixels 210. Further, the sealing planarizing film 422 is formed between the lower layer barrier film 420 and the upper layer barrier film 424 so as to be thinner in the frame region than in the display region. Specifically, as illustrated in FIG. 4, the sealing planarizing film 422 is formed in the display region 212 and on the inner side of the blocking portion 206 in the frame region 214 so as to cover the lower layer barrier film 420 and to be thinner in the frame region than in the display region. Now, a method of forming the sealing planarizing film 422, and the action and effect of the buffering portions 204 and the blocking portions 206 are described with reference to FIG. 5A and FIG. 5B.

FIG. 5A and FIG. 5B are views for illustrating the method of forming the sealing planarizing film 422. As illustrated in FIG. 5A, on the array substrate 202 in a state in which the respective layers from the circuit layer 402 to the lower layer barrier film 420 are formed on the substrate 400, the sealing material 500 is applied to the display region 212 and to an end of the frame region 214 by printing, an ink jet method, or other methods. In this case, in order to cover the display region 212 and the frame region 214 in a region on the inner side of the blocking portion 206 even when foreign matters and the like are present on the cathode electrode 414, the sealing material 500 is desired to be applied with a sufficient volume. Specifically, for example, the sealing material 500 is applied to the display region 212 so as to have a thickness of about 10 micrometers.

The dropped sealing material 500 has wettability, and hence the dropped sealing material 500 is wetted and spread as indicated by the arrow in FIG. 5A from the display region 212 toward the frame region 214. In this case, the sealing material 500 is wetted and spread toward the frame region 214 at a speed depending on the wettability and the volume of the applied sealing material 500. For the sealing material 500, for example, a resin material having a contact angle of from about 1 degree to about 3 degrees is used. Then, after the sealing material 500 reaches the buffering portions 204, because the buffering portions 204 have a protruded shape, the wetting and spreading speed of the sealing material 500 is decreased.

Further, the buffering portions 204 are formed at least at two positions so as to be separated from each other on a path extending from the display region 212 to reach the blocking portion 206. The wetting and spreading speed of the sealing material 500 after climbing over the buffering portion 204 formed on the outer side and reaching the blocking portion 206 is decreased to a speed that is incapable of climbing over the blocking portion 206. Then, as illustrated in FIG. 5B, the sealing material 500 is fixed on the inner side of the blocking portion 206 in a shape in which the height is gradually decreased from the display region 212 toward the frame region 214, and thus the sealing planarizing film 422 is obtained. With the above-mentioned method, the sealing planarizing film 422 is formed.

Next, description is made with reference back to FIG. 4. The upper layer barrier film 424 is formed so as to cover the array substrate 202. Specifically, the upper layer barrier film 424 is formed in the upper layer of the sealing planarizing film 422 on the inner side of the blocking portion 206, and is formed in the upper layer of the lower layer barrier film 420 in the vicinity of the blocking portion 206. As illustrated in FIG. 4, the thickness of the sealing planarizing film 422 is gradually decreased from the vicinity of the display region 212 toward the end of the substrate 400. Therefore, the upper layer barrier film 424 can be in contact with the lower layer barrier film 420 without interposing a high step, and thus the sealing effect can be reliably obtained. Further, in conformity with the thickness of the sealing planarizing film 422, the thickness of the sealing film 416 is also gradually decreased toward the end of the substrate 400.

As described above, the buffering portions 204 prevent a situation where the sealing material 500 made of a resin material climbs over the blocking portion 206 to reach the substrate end. In this embodiment, the light emitting layer is formed with use of materials for emitting red light, green light, and blue light, but the light emitting layer may be formed with use of a material for emitting white light. In this case, the array substrate 202 is bonded to an opposing substrate having a color filter formed thereon so that the display device 100 can perform color display. Further, although not shown in FIG. 4, a polarizing plate may be bonded in the upper layer of the upper layer barrier film 424, to thereby suppress reflection in the pixels 210.

Further, in the above, description is made of a case where the buffering portions 204 are doubly formed seamlessly so as to surround the display region 212 on the outer side of the cathode contact 300, but the shape of the buffering portions 204 is not limited thereto. The shapes of the buffering portions 204 according to other embodiments of the present invention are described with reference to FIG. 6A to FIG. 6C.

Figure 6A:
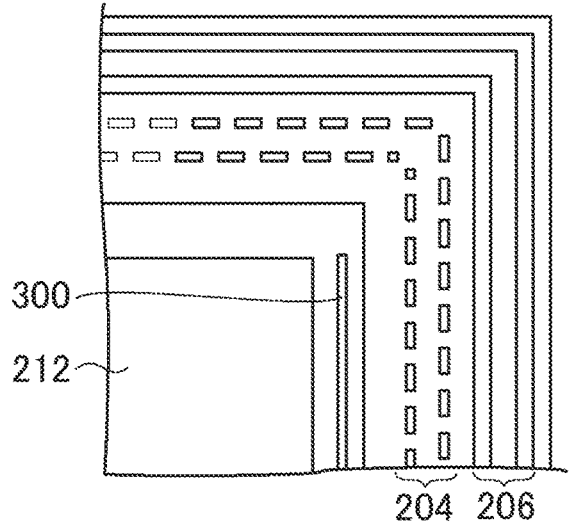
FIG. 6A, FIG. 6B, and FIG. 6C are views for illustrating shapes of buffering portions according to other embodiments of the present invention.
Figure 6B:
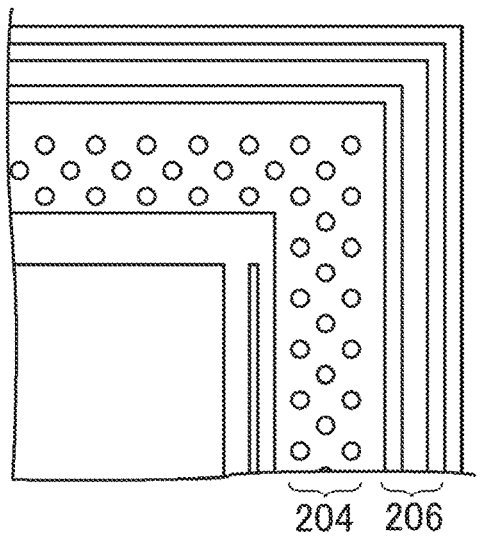
Figure 6C:
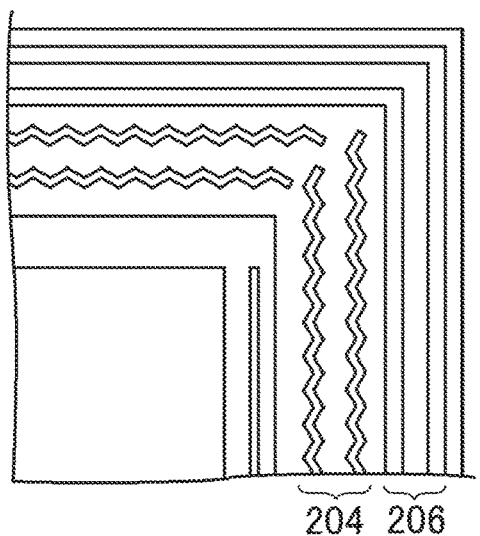

FIG. 6A to FIG. 6C are views for illustrating the shapes of the buffering portions 204 according to the other embodiments. As illustrated in FIG. 6A and FIG. 6B, the buffering portions 204 may be arranged at predetermined intervals in plan view. Specifically, as illustrated in FIG. 6A, the buffering portions 204 may be formed into a broken-line shape.

Further, the buffering portions 204 may be formed of an aggregate of columnar-shaped planarizing films 406. Specifically, the planarizing films 406 arranged at certain intervals may be alternately arranged in a shifted manner from the display region 212 toward the frame region 214, to thereby form the buffering portions 204. When the buffering portions 204 are arranged at certain intervals as illustrated in FIG. 6B, the volume of the buffering portions 204 can be reduced as compared to the case where the buffering portions 204 are seamlessly formed. The receiving amount of the sealing material 500 in the frame region 214 is increased, and hence a fear that the sealing material 500 overflows from the inner side of the blocking portion 206 to climb over the blocking portion 206 to the outer side can be reduced.

Further, as illustrated in FIG. 6C, the buffering portions 204 may be formed into a wave shape in plan view. Even with this configuration, the buffering portions 204 can decrease the wetting and spreading speed of the sealing material 500, and hence the fear that the sealing material 500 overflows from the inner side of the blocking portion 206 to climb over the blocking portion 206 to the outer side can be reduced.

Further, the buffering portions 204 may be formed to have a gap at a corner of the frame region 214. Specifically, as illustrated in FIG. 6A to FIG. 6C, a gap of the buffering portions 204 is formed at the corner of the frame region 214, to thereby guide the sealing material 500 to flow into the gap when the sealing material 500 is wetted and spread. With this configuration, the volume of the sealing material 500 that flows into a region other than the corner can be reduced. Thus, in the region other than the corner, the speed at which the sealing material 500 reaches the blocking portion 206 can be decreased. The distance from the display region 212 to the blocking portion 206 is longer in the corner than in the region other than the corner, and hence the speed at which the sealing material 500 reaches the blocking portion 206 can be more decreased in the corner than in the region other than the corner.

Figure 7:
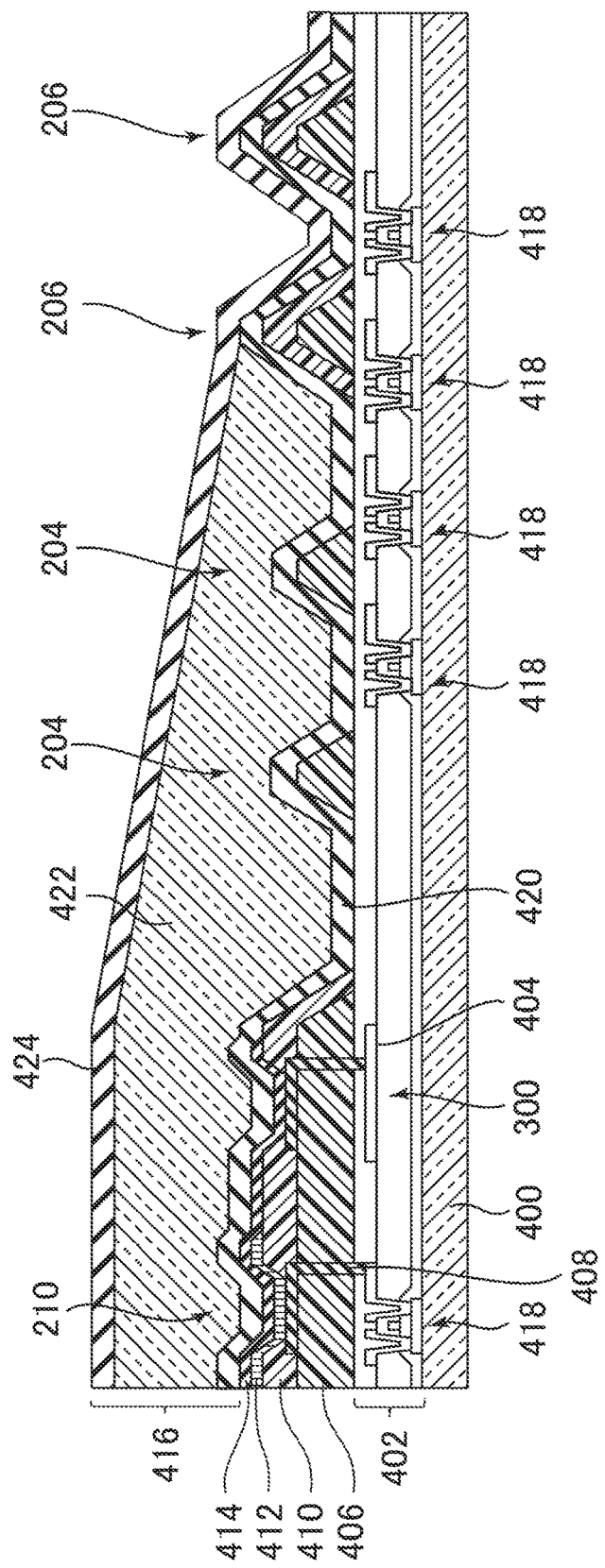
FIG. 7 is a view for illustrating shapes of buffering portions according to still another embodiment of the present invention.

Further, in the above, description is made of a case where the buffering portions 204 are formed to have the same height as the blocking portions 206, but as illustrated in FIG. 7, the buffering portions 204 may be formed to be lower than the blocking portions 206. Specifically, similarly to the above, the blocking portions 206 are formed of the protruded planarizing films 406, and the ribs 410 and the lower layer barrier film 420 formed in the upper layer of the planarizing films 406. Meanwhile, the buffering portions 204 are formed of the protruded planarizing films 406, and the lower layer barrier film 420 formed in the upper layer of the planarizing films 406. That is, the buffering portions 204 are formed lower than the blocking portions 206 by the thickness of the ribs 410. Therefore, as compared to the above-mentioned case, the volume of the buffering portions 204 can be reduced, to thereby increase the receiving amount of the sealing material in the peripheral region. As a result, the fear that the sealing material 500 climbs over the blocking portion 206 can be reduced. The height of the planarizing film 406, which is formed as a part of the buffering portion 204, may be set smaller than the height of the planarizing film 406, which is formed as a part of the blocking portion 206, such that the height of the buffering portion 204 is smaller than the height of the blocking portion 206.

Further, the buffering portions 204 formed at two positions so as to be separated from, each other may be formed with different heights. Specifically, for example, in sectional view, the buffering portions 204 may be formed higher on the inner side, or higher on the outer side. The wetting and spreading speed of the sealing material 500 is decreased toward the outer side. Thus, when the buffering portions 204 are formed such that the height is decreased on the outer side, the volume of the buffering portions 204 can be reduced.

According to the above-mentioned embodiments, as compared to the case where the buffering portions 204 are seamlessly formed, the speed at which the sealing material 500 reaches the blocking portion 206 can be decreased. Thus, the fear that the sealing material 500 climbs over the blocking portion 206 can be reduced. Further, the blocking portion 206 can be formed on a further inner side, and thus the frame can be narrowed.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, including a display region formed of a plurality of pixels and a frame region formed on an outer side of the display region, comprising:
a sealing film configured to cover the display region;
a blocking portion formed in the frame region surrounding the display region; and
buffering portions formed at least at two positions so as to be separated from each other on at least one straight line path extending from the display region to reach the blocking portion, wherein
the buffering portions include a first film in a same layer in which a planarizing film is positioned between a circuit layer and an anode electrode.

2. The display device according to claim 1, wherein the buffering portions have a wave shape in plan view.

3. The display device according to claim 1, wherein the buffering portions are arranged at a predetermined interval in plan view.

4. The display device according to claim 1, wherein the buffering portions have a gap at a corner of the frame region.

5. The display device according to claim 1, wherein the buffering portions are formed lower than the blocking portion in sectional view.

6. The display device according to claim 1, wherein the buffering portions formed at the two positions so as to be separated from each other are formed so as to be higher on an inner side in sectional view.

7. The display device according to claim 1, wherein the buffering portions include a second film in a same layer in which a rib is positioned, the rib dividing the plurality of pixels.

8. The display device according to claim 7, wherein the buffering portions are laminate of the first film and the second film.

9. The display device according to claim 1, wherein the blocking portion includes the first film.

10. The display device according to claim 9, wherein the blocking portion includes a second film in a same layer in which a rib is positioned, the rib dividing the plurality of pixels.

11. The display device according to claim 10, wherein the blocking portion is laminate of the first film and the second film.

12. A display device, including a display region formed of a plurality of pixels and a frame region formed on an outer side of the display region, comprising:
a pixel comprising a pixel circuit and a light emitting element corresponding to the pixel circuit;
a sealing film configured to cover the display region and the frame region;
a substrate having the pixel formed thereon;
a blocking portion formed in the frame region so as to upwardly protrude; and
two buffering portions formed between the display region and the blocking portion so as to be separated from each other and to protrude toward the sealing film side, wherein
the two buffering portions include a first film in a same layer in which a planarizing film is positioned between a circuit layer and an anode electrode.

13. The display device according to claim 12, wherein the blocking portion includes the first film.

14. The display device according to claim 13, wherein the blocking portion includes a second film in a same layer in which a rib is positioned, the rib dividing the plurality of pixels.

15. The display device according to claim 14, wherein the blocking portion is laminate of the first film and the second film.

16. The display device according to claim 12,
wherein the sealing film comprises a lower layer barrier film, an upper layer barrier film, and a sealing planarizing film formed between the lower layer barrier film and the upper layer barrier film, and
wherein the sealing planarizing film is thinner in the frame region than in the display region.

17. The display device according to claim 16, wherein the sealing film has a thickness that is gradually decreased toward an end of the substrate.

18. The display device according to claim 12, wherein the two buffering portions include a second film in a same layer in which a rib is positioned, the rib dividing the plurality of pixels.

19. The display device according to claim 18, wherein the two buffering portions are laminate of the first film and the second film.

* * * * *